(12) United States Patent
Lin

(10) Patent No.: US 11,864,315 B2
(45) Date of Patent: Jan. 2, 2024

(54) VERTICAL INTERCONNECTION STRUCTURE OF A MULTI-LAYER SUBSTRATE

(71) Applicant: MEDIATEK INC., Hsin-Chu (TW)

(72) Inventor: Yi-Chieh Lin, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 336 days.

(21) Appl. No.: 17/092,312

(22) Filed: Nov. 8, 2020

(65) Prior Publication Data

US 2021/0168935 A1 Jun. 3, 2021

Related U.S. Application Data

(60) Provisional application No. 62/941,929, filed on Nov. 29, 2019.

(51) Int. Cl.
| | |
|---|---|
| H05K 1/11 | (2006.01) |
| H05K 1/02 | (2006.01) |
| H01L 23/498 | (2006.01) |
| H01L 23/66 | (2006.01) |

(52) U.S. Cl.
CPC ........ H05K 1/113 (2013.01); H01L 23/49822 (2013.01); H01L 23/66 (2013.01); H05K 1/0222 (2013.01); H05K 1/0224 (2013.01); H01L 2223/6616 (2013.01); H05K 1/115 (2013.01); H05K 2201/093 (2013.01); H05K 2201/10098 (2013.01)

(58) Field of Classification Search
CPC .................. H05K 1/113; H05K 1/0224; H05K 2201/093; H05K 2201/10098; H01L 23/49822; H01L 23/66; H01L 2223/6616; H01L 23/5225; H01L 23/5227; H01L 23/5283; H01L 23/5226
See application file for complete search history.

(56) References Cited

U.S. PATENT DOCUMENTS

| | | | | |
|---|---|---|---|---|
| 2005/0098348 | A1* | 5/2005 | Okumichi | H01L 23/66 174/262 |
| 2005/0190614 | A1* | 9/2005 | Brunette | H05K 1/0251 365/192 |
| 2008/0073796 | A1* | 3/2008 | Harvey | H01L 23/49827 257/774 |
| 2010/0061035 | A1 | 3/2010 | Kitamura | |
| 2010/0282503 | A1* | 11/2010 | Kushta | H05K 1/0251 174/266 |
| 2012/0286393 | A1 | 11/2012 | Lin | |
| 2014/0231992 | A1 | 8/2014 | Ding | |

FOREIGN PATENT DOCUMENTS

| | | |
|---|---|---|
| TW | 201409650 A | 3/2014 |
| TW | 201733013 A | 9/2017 |

\* cited by examiner

*Primary Examiner* — Ishwarbhai B Patel
(74) *Attorney, Agent, or Firm* — Winston Hsu

(57) ABSTRACT

A vertical interconnection structure of a multi-layer substrate includes a first via pad disposed in a first layer of metal interconnect of the multi-layer substrate; a second via pad disposed in a second layer of metal interconnect of the multi-layer substrate; a signal via electrically connecting the first via pad to the second via pad; a non-circular first ground plane disposed in the first layer of metal interconnect of the multi-layer substrate and surrounding the first via pad; and a non-circular first ground pullback region between the first via pad and the non-circular first ground plane for electrically isolating the first via pad from the non-circular first ground plane.

19 Claims, 4 Drawing Sheets

VERTICAL INTERCONNECTION STRUCTURE OF A MULTI-LAYER SUBSTRATE

CROSS REFERENCE TO RELATED APPLICATIONS

This application claims priority from U.S. provisional application No. 62/941,929 filed on Nov. 29, 2019, the disclosure of which is included in its entirety herein by reference.

BACKGROUND

This invention relates generally to a vertical interconnection structure for interconnecting circuitry on an upper layer to a circuitry on a lower layer of a multi-layer substrate or a circuit board.

As known in the art, vertical interconnection is one of the key components for on chip, on package substrate and on PCB, especially in high frequency or millimeter-wave applications. Conventional vertical connections in a multi-layer substrate exhibit strong capacitive behavior resulting from dielectric loading due to the presence of the substrate and dielectrics. It is a great concern under limited design solutions in the real fabrication to reduce the mismatch caused by strong capacitance at high frequencies and also reduced insertion loss.

SUMMARY

It is one object of the invention to provide an improved a vertical interconnection structure of a multi-layer substrate to solve the above-mentioned deficiencies or shortcomings.

According to one aspect of the invention, a vertical interconnection structure of a multi-layer substrate includes a first via pad disposed in a first layer of metal interconnect of the multi-layer substrate; a second via pad disposed in a second layer of metal interconnect of the multi-layer substrate; a signal via electrically connecting the first via pad to the second via pad; a non-circular first ground plane disposed in the first layer of metal interconnect of the multi-layer substrate and surrounding the first via pad; and a non-circular first ground pullback region between the first via pad and the non-circular first ground plane for electrically isolating the first via pad from the non-circular first ground plane.

According to some embodiments, the vertical interconnection structure of a multi-layer substrate further comprises: a non-circular second ground pullback region disposed between the second via pad and the non-circular second ground plane for electrically isolating the second via pad from the non-circular second ground plane.

According to some embodiments, the first via pad and the second via pad have a circular shape when viewed from above.

According to some embodiments, the vertical interconnection structure of a multi-layer substrate further comprises: a plurality of ground vias interconnecting the non-circular first ground plane to the non-circular second ground plane.

According to some embodiments, the signal via is surrounded by the plurality of ground vias.

According to some embodiments, the non-circular first ground pullback region has a rectangular shape or a quasi-rectangular shape around a perimeter of the first via pad when viewed from above.

According to some embodiments, the non-circular second ground pullback region has a rectangular shape or a quasi-rectangular shape around a perimeter of the second via pad when viewed from above.

According to some embodiments, the vertical interconnection structure of a multi-layer substrate further comprises: a signal trace terminating at the second via pad.

According to some embodiments, the second via pad and the signal trace are backed by a ground plane disposed on a third layer of metal interconnect.

According to some embodiments, the e plurality of ground vias and the signal via have a strip shape and are in parallel to one another.

According to some embodiments, the plurality of ground vias and the signal via have longitudinal axes that extend along a first direction.

According to some embodiments, the vertical interconnection structure of a multi-layer substrate further comprises: a close-loop, ring-type ground via interconnecting the non-circular first ground plane to the non-circular second ground plane.

According to some embodiments, the close-loop, ring-type ground via surrounds the signal via.

According to some embodiments, the vertical interconnection structure of a multi-layer substrate further comprises: a dielectric layer between the first layer of metal interconnect and the second layer of metal interconnect.

According to some embodiments, the multi-layer substrate is a packaging substrate or a printed circuit board.

According to another aspect of the invention, a vertical interconnection structure particularly suited for radio frequency devices is disclosed. The vertical interconnection structure may comprise a signal path disposed in a substrate, a first ground plane surrounding the signal path, and a first ground pullback region disposed between the signal path and the first ground plane. The first ground pullback region electrically isolates the signal path from the first ground plane. The first ground pullback region has at least two different widths.

According to some embodiments, the signal path comprises a first via pad. The first ground pullback region is a gap between the first via pad and the first ground plane. According to some embodiments, the signal path further comprises a second via pad, and a signal via electrically connecting the first via pad to the second via pad.

According to some embodiments, the vertical interconnection structure further comprises a second ground plane surrounding the second via pad; and a second ground pullback region disposed between the second via pad and the second ground plane. The second ground pullback region electrically isolates the second via pad from the second ground plane. The second ground pullback region has at least two different widths.

According to some embodiments, the vertical interconnection structure further comprises at least one ground via interconnecting the first ground plane to the second ground plane.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

The present invention pertains to a circuit board topology that is capable of extending operating frequency and achieving better voltage standing wave ratio (VSWR) performance than traditional substrate design. Packaging of an integrated circuit (IC) chip can involve attaching the IC chip to a substrate (a packaging substrate) which, among other things, provides mechanical support and electrical connections between the chip and other electronic components of a device. Substrate types include, for example, cored substrates, including thin core, thick core (laminate BT (bismaleimide-triazine resin) or FR-4 type fibrous board material), and laminate core, as well as coreless substrates. Cored package substrates, for example, can be built up layer by layer around a central core, with layers of conductive material (usually copper) separated by layers of insulating dielectric, with interlayer connections being formed with through holes or microvias (vias). In other embodiments, the substrate could be a flexible substrate or flexible PCB, which is made of a thin, heat-resistant material, typically made of polymers like polyimide and polyethylene terephthalate (PET).

Figure 1:
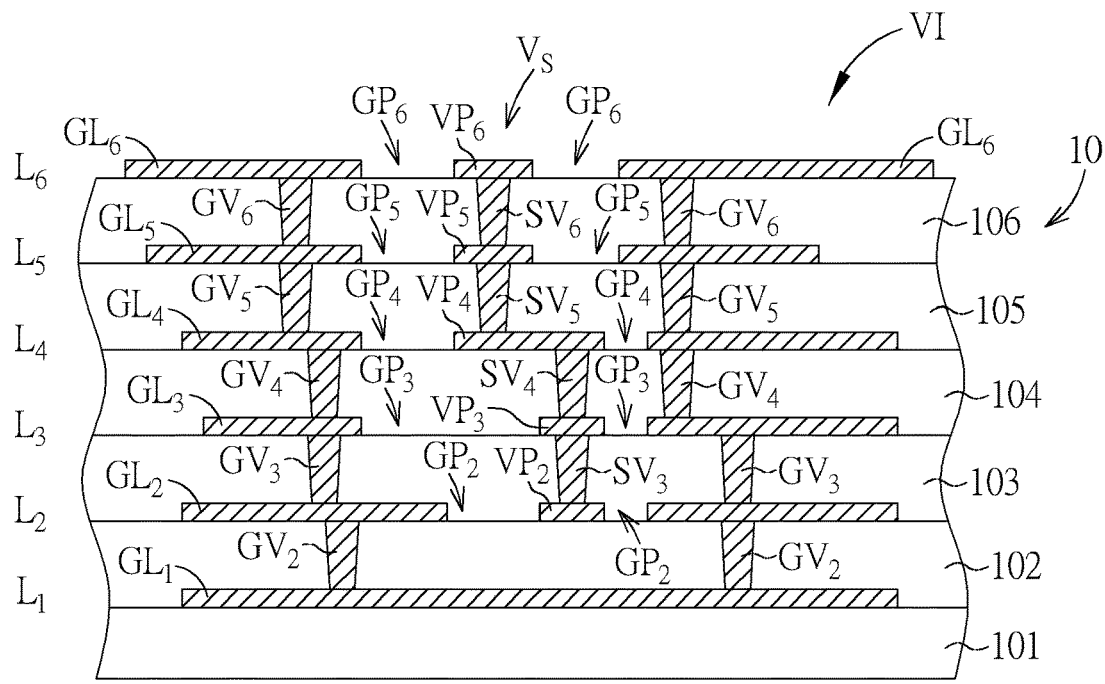
FIG. 1 is a schematic, cross-sectional diagram showing a vertical interconnection structure in a multi-layer substrate according to one embodiment of the invention.
Figure 2:
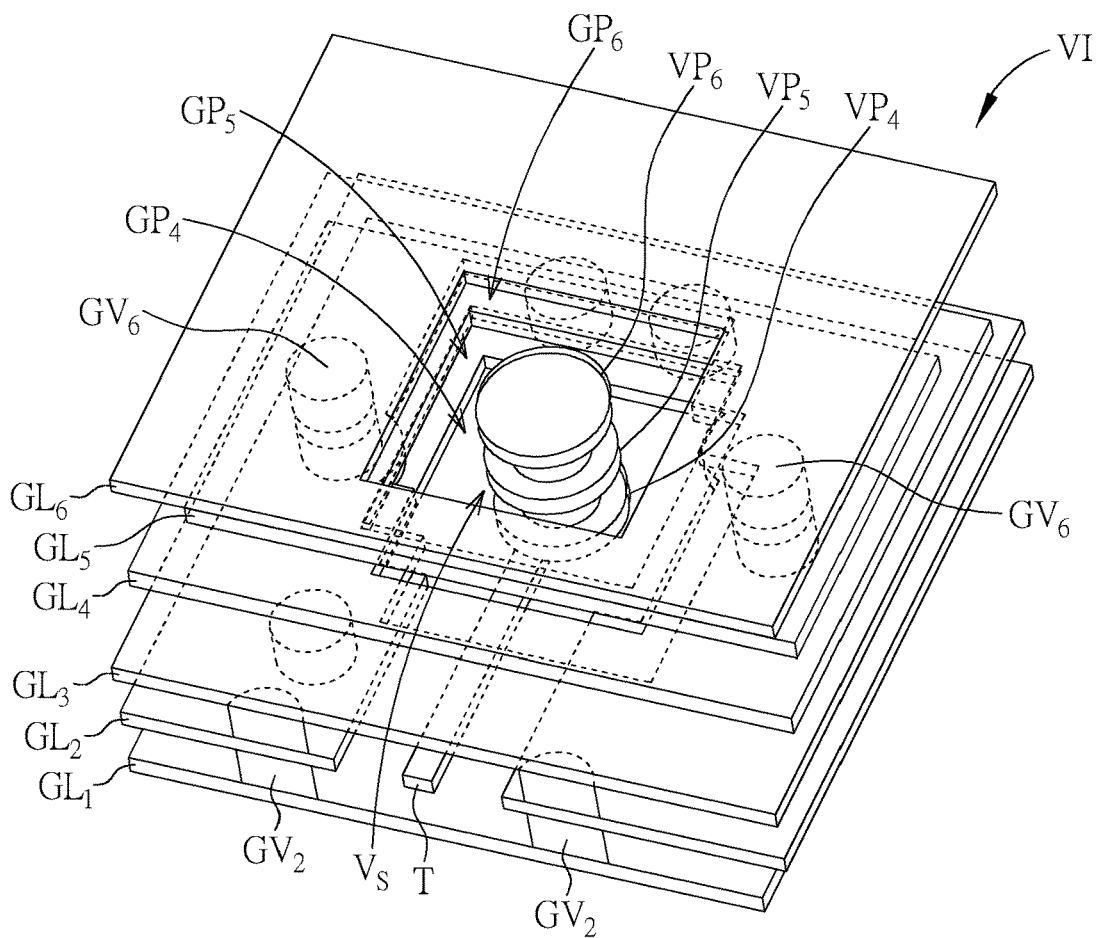
FIG. 2 is a perspective view showing the vertical interconnection structure in FIG. 1.

Please refer to FIG. 1 and FIG. 2. FIG. 1 is a schematic, cross-sectional diagram showing a vertical interconnection structure in a multi-layer substrate according to one embodiment of the invention. FIG. 2 is a perspective view showing the vertical interconnection structure in FIG. 1. It is to be understood that the number of layers of the multi-layer substrate is for illustration purposes only. For the sake of simplicity, exemplary six layers of metal interconnect ($L_1$-$L_6$) are shown in the figures. In FIG. 2, the dielectric layers are omitted. It is to be understood that the dimensions and precise number of layers of the vertical interconnection structure may depend upon the design requirements in different cases.

As shown in FIG. 1 and FIG. 2, a vertical interconnection structure VI is fabricated in a multi-layer substrate 10 including, but not limited to, six layers of metal interconnect ($L_1$-$L_6$). According to an embodiment, the vertical interconnection structure VI may be a signal trace-to-via transition constructed in accordance with one embodiment of the invention. For example, the vertical interconnection structure VI may be used to transmit radio frequency (RF) signals between a RF chip or die and an antenna element (not shown). For example, the antenna element may be disposed in the multi-layer substrate 10, but not limited thereto. According to an embodiment, the multi-layer substrate 10 may include, but not limited to, a packaging substrate, a printed circuit board, or the like. According to an embodiment, the multi-layer substrate 10 may include a RF circuit board that is suitable for 5G applications.

According to an embodiment, the multi-layer substrate 10 may comprise a plurality of layers of dielectric material (or build-up layers) 101-106. According to an embodiment, the vertical interconnection structure VI may comprise a signal via structure Vs that is composed of a top layer via pad $VP_6$, a conductor via $SV_6$ connecting the top layer via pad $VP_6$ to an inner layer via pad $VP_5$, a conductor via $SV_5$ connecting the inner layer via pad $VP_5$ to an inner layer via pad $VP_4$, a conductor via $SV_4$ connecting the inner layer via pad $VP_4$ to an inner layer via pad $VP_3$, and a conductor via $SV_3$ connecting the inner layer via pad $VP_3$ to an inner layer via pad $VP_2$. According to an embodiment, the conductor vias $SV_3$-$SV_6$ may be disposed in the dielectric layers 103-106, respectively. According to an embodiment, the conductor vias $SV_3$-$SV_6$ may be contributed as a conductive path, for example, a signal path to transmit radio frequency (RF) signal. An exemplary signal trace T that terminates at the inner layer via pad $VP_2$ is disposed on the metal interconnect layer $L_2$. The inner layer via pad $VP_2$ and the signal trace T are backed by a ground plane $GL_1$ disposed on the metal interconnect layer $L_1$. The dielectric layer 102 is disposed between the inner layer via pad $VP_2$ and the ground plane $GL_1$. In some embodiments, the top layer via pad $VP_6$ may be a bump pad.

According to an embodiment, the vertical interconnection structure VI further comprises a ground plane (or frame) $GL_6$ disposed around the perimeter of the top layer via pad $VP_6$, a ground plane $GL_5$ disposed around the perimeter of the inner layer via pad $VP_5$, a ground plane $GL_4$ disposed around the perimeter of the inner layer via pad $VP_4$, a ground plane $GL_3$ disposed around the perimeter of the inner layer via pad $VP_3$, and a ground plane $GL_2$ disposed around the perimeter of the inner layer via pad $VP_2$. A ground pullback region $GP_6$ is disposed between the ground plane $GL_6$ and the top layer via pad $VP_6$. A ground pullback region $GP_5$ is disposed between the ground plane $GL_5$ and the inner layer via pad $VP_5$. A ground pullback region $GP_4$ is disposed between the ground plane $GL_4$ and the inner layer via pad $VP_4$. A ground pullback region $GP_3$ is disposed between the ground plane $GL_3$ and the inner layer via pad $VP_3$. A ground pullback region $GP_2$ is disposed between the ground plane $GL_2$ and the inner layer via pad $VP_2$. As can be discerned from FIG. 2, the ground pullback regions $GP_2$-$GP_6$ have a non-circular shape, such as a rectangular shape or a quasi-rectangular shape (two merged or partially overlapping rectangles), and electrically isolate the circular shaped via pads $VP_2$-$VP_6$ from the ground planes $GL_2$-$GL_6$, respectively.

According to an embodiment, the vertical interconnection structure VI further comprises ground vias $GV_6$ between the ground plane $GL_6$ and the ground plane $GL_5$, ground vias $GV_5$ between the ground plane $GL_5$ and the ground plane $GL_4$, ground vias $GV_4$ between the ground plane $GL_4$ and the ground plane $GL_3$, ground vias $GV_3$ between the ground plane $GL_3$ and the ground plane $GL_2$, and ground vias $GV_2$ between the ground plane $GL_2$ and the ground plane $GL_1$.

Figure 3:
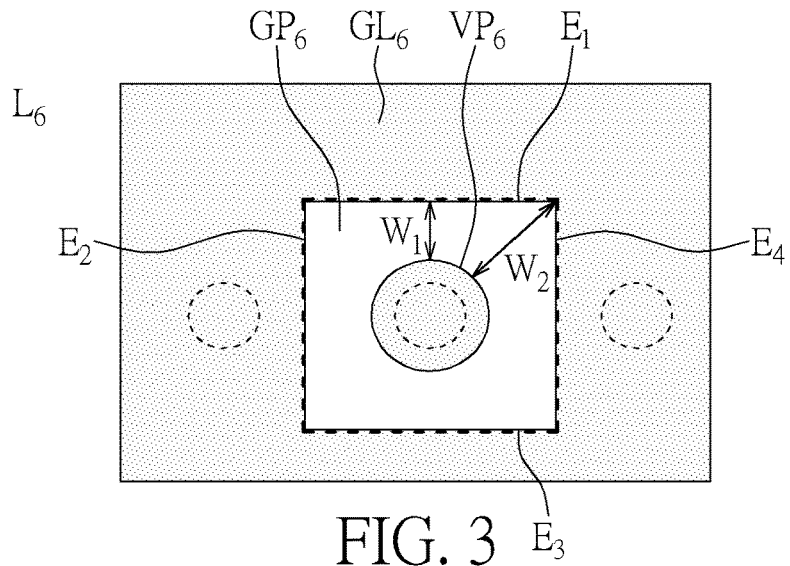
FIG. 3 to FIG. 7 illustrate layer views of the vertical interconnection structure in FIG. 1 and FIG. 2 according to an embodiment of the invention.
Figure 4:
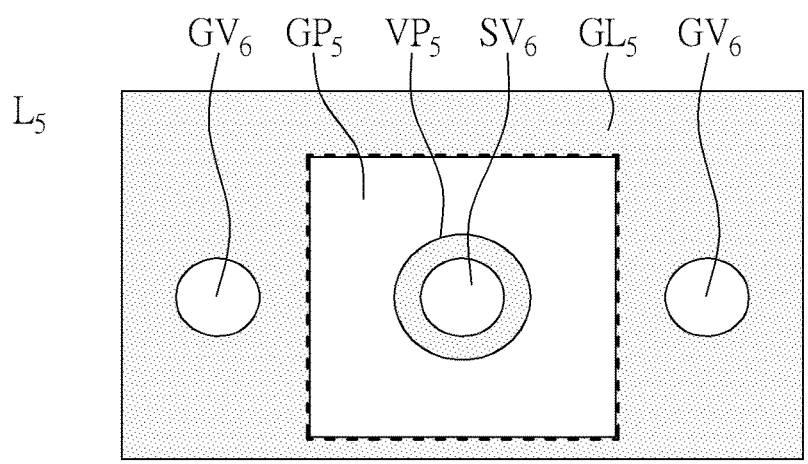
Figure 5:
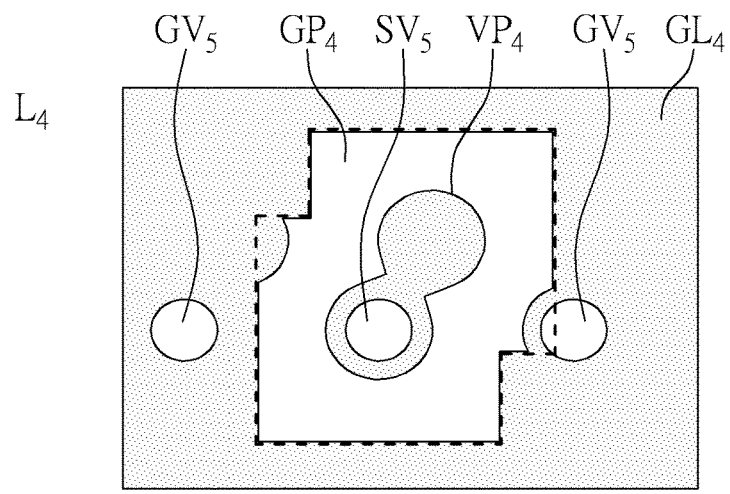
Figure 6:
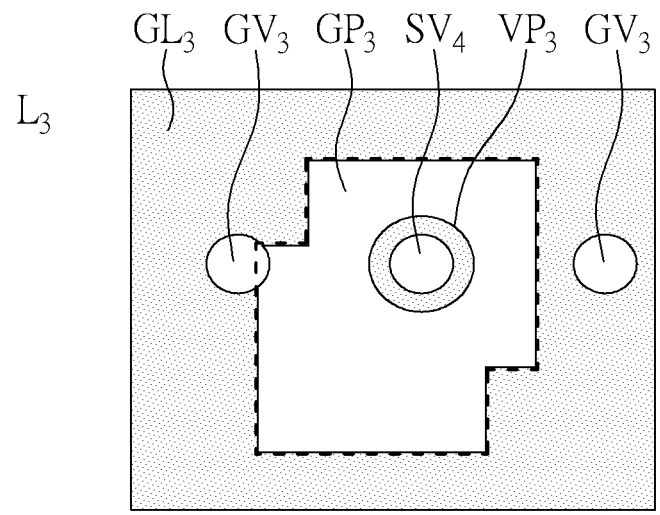
Figure 7:
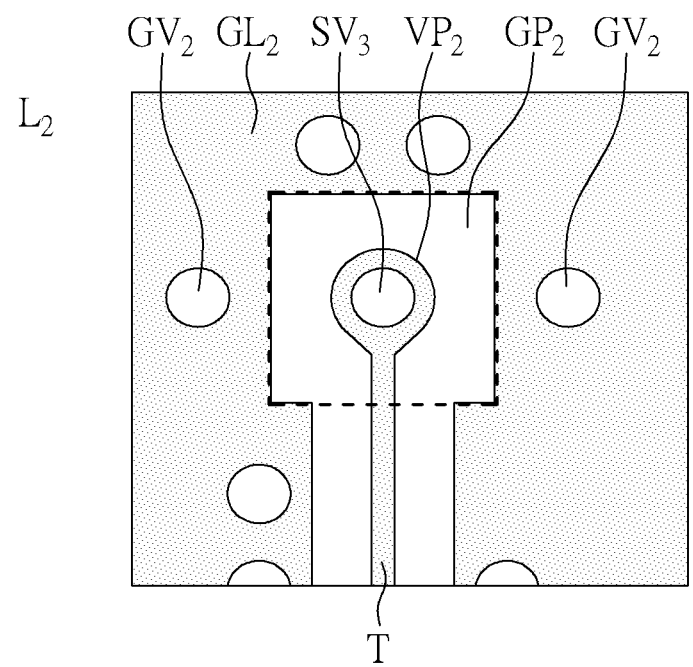

Please refer to FIG. 3 to FIG. 7. FIG. 3 to FIG. 7 illustrate layer views of the vertical interconnection structure VI from layer $L_6$ to $L_2$ in FIG. 1 and FIG. 2 according to an embodiment of the invention. As shown in FIG. 3, the ground pullback region $GP_6$ is disposed between the non-circular ground plane $GL_6$ and the top layer via pad $VP_6$. The outer boundary of the ground pullback region $GP_6$ has a non-circular shape, preferably a rectangular shape or a square shape. The ground pullback region $GP_6$ electrically isolates the circular shaped top layer via pad $VP_6$ from the ground plane $GL_6$. As shown in FIG. 4, the ground pullback region $GP_5$ is disposed between the non-circular ground plane $GL_5$ and the inner layer via pad $VP_5$. The outer boundary of the ground pullback region $GP_5$ has a non-circular shape, preferably a rectangular shape or a square shape. The ground pullback region $GP_5$ electrically isolates the circular shaped via pad $VP_5$ from the ground plane $GL_5$. As shown in FIG. 5, the ground pullback region $GP_5$ is disposed between the non-circular ground plane $GL_4$ and the inner layer via pad $VP_4$. For example, the inner layer via pad $VP_4$ may comprise two partially overlapping circular pads. The outer boundary of the ground pullback region $GP_4$ has a non-circular shape, for example, a quasi-rectangular shape or a quasi-square shape (two merged or partially overlapping rectangles). The ground pullback region $GP_4$ electrically isolates the circular shaped via pad $VP_4$ from the ground plane $GL_4$. As shown in FIG. 6, the ground pullback region $GP_3$ is disposed between the non-circular ground plane $GL_3$ and the inner layer via pad $VP_3$. The outer boundary of the ground pullback region $GP_3$ has a non-circular shape, preferably a quasi-rectangular shape or a quasi-square shape. The ground pullback region $GP_3$ electrically isolates the circular shaped via pad $VP_3$ from the ground plane $GL_3$. As shown in FIG. 7, the ground pullback region $GP_2$ is disposed between the non-circular ground plane $GL_2$ and the inner layer via pad $VP_2$. The outer boundary of the ground pullback region $GP_2$ has a non-circular shape, preferably a rectangular shape or a quasi-square shape. The ground pullback region $GP_2$ electrically isolates the circular shaped via pad $VP_2$ from the ground plane $GL_2$. The non-circular ground plane $GL_2$ is formed in such as manner so as to surround the trace T in plane.

According to an embodiment, the outer boundary of the ground pullback regions, for example, the rectangular shaped ground pullback region $GP_6$ in FIG. 3 or the polygonal shaped ground pullback region $GP_4$ in FIG. 5, may generally include at least one set of opposite, parallel sides. For example, the rectangular shaped ground pullback region $GP_6$ in FIG. 3 has four sides E1~E4. The sides E1 and E3 are in parallel to each other and the sides E2 and E4 are in parallel to each other. Further, as shown in FIG. 3, the annular ground pullback region $GP_6$ may have various widths. For example, in FIG. 3, the width $W_1$ is smaller than the width $W_2$.

Figure 8:
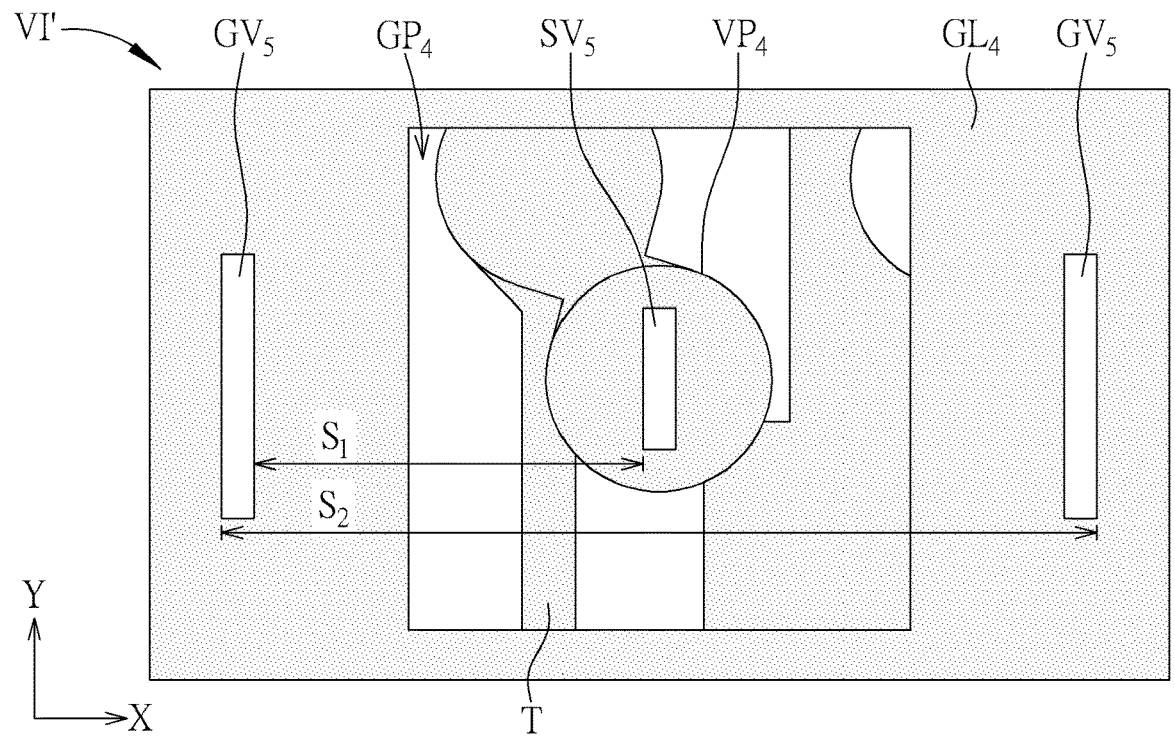
FIG. 8 is a schematic plan view showing non-circular ground vias and non-circular signal via of the vertical interconnection structure according to an embodiment of the invention.

Please refer to FIG. 8. FIG. 8 is a schematic plan view showing non-circular ground vias and non-circular signal via of a vertical interconnection structure according to an embodiment of the invention. As shown in FIG. 8, the vertical interconnection structure VI' comprises non-circular (or trench-type) ground vias, for example, ground vias $GV_5$, electrically connected to a ground plane, for example, ground plane $GL_4$, and a non-circular (or trench-type) signal via, for example, signal via $SV_5$, electrically connected to an inner layer via pad, for example, via pad $VP_4$. The trench-type ground vias $GV_5$ and the trench-type signal via $SV_5$ have a strip shape and are in parallel to one another. According to an embodiment, the trench-type ground vias $GV_5$ and the trench-type signal via $SV_5$ have longitudinal axes that extend along a reference Y-axis direction.

It is beneficial to use such trench-type ground vias $GV_5$ and the trench-type signal via $SV_5$ in the vertical interconnection structure VI' because the lateral distance $S_1$ along a reference X-axis direction between inner edges of the trench-type ground via $GV_5$ and the trench-type signal via $SV_5$ is increased compared to the circular type ground via and signal via as set forth in FIG. 3 to FIG. 7. According to an embodiment, the lateral distance $S_2$ along the reference X-axis direction between outer edges of the two trench-type ground vias $GV_5$ remains substantially the same compared to the circular type ground vias as set forth in FIG. 3 to FIG. 7.

Figure 9:
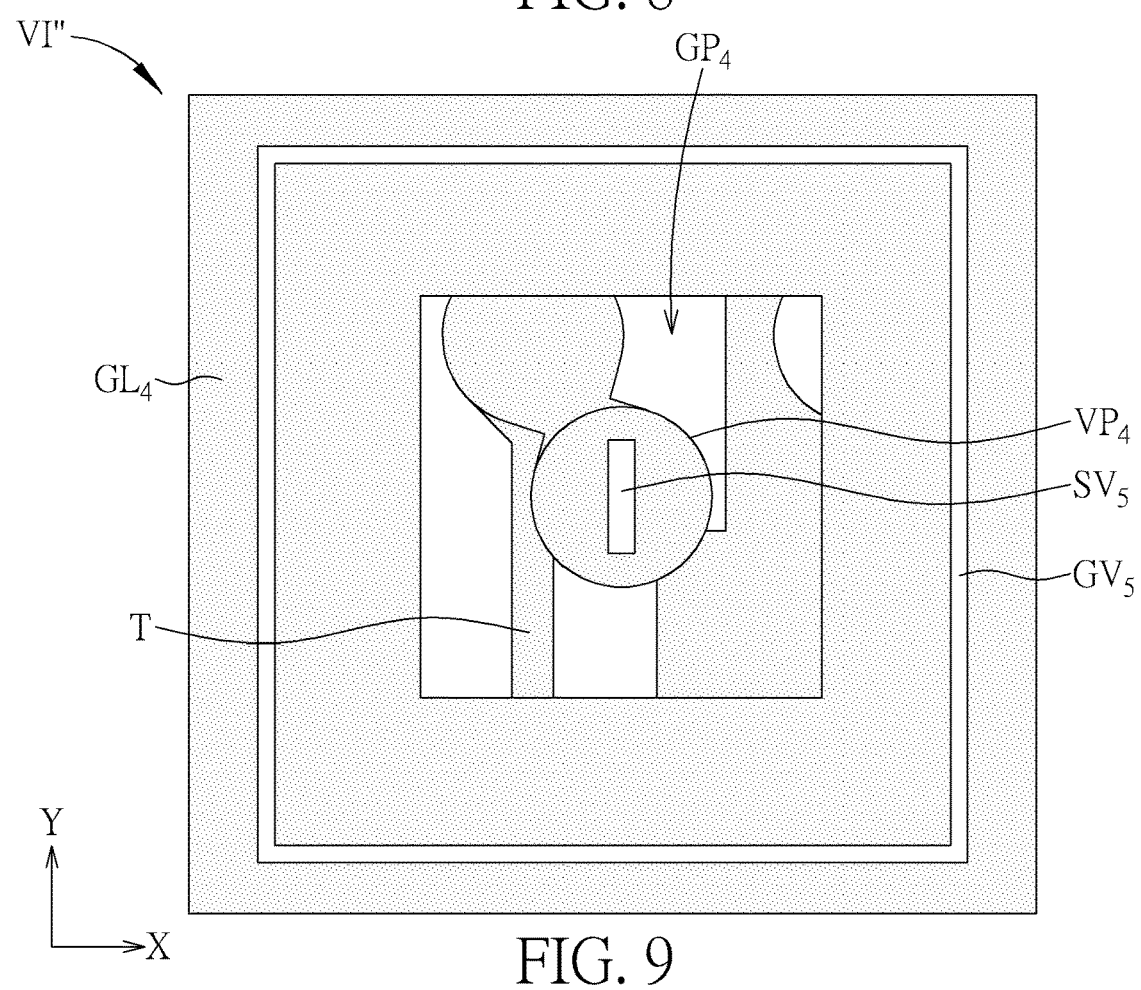
FIG. 9 is a schematic plan view showing ring-type ground vias surrounding the non-circular signal via of the vertical interconnection structure according to another embodiment of the invention.

FIG. 9 is a schematic plan view showing a close-loop, ring-type ground via surrounding a non-circular signal via of a vertical interconnection structure according to another embodiment of the invention. As shown in FIG. 9, the vertical interconnection structure VI" comprises a close-loop, ring-type ground via, for example, ring-type ground via $GV_5$, electrically connected to a ground plane, for example, ground plane $GL_4$. The ring-type ground via $GV_5$ surrounds a non-circular (or trench-type) signal via, for example, signal via $SV_5$, electrically connected to an inner layer via pad, for example, via pad $VP_4$. It is beneficial to use such close-loop, ring-type ground via in the vertical interconnection structure VI" because the electromagnetic interference (EMI) shielding effect can be improved.

In summary, a vertical interconnection structure particularly suited for radio frequency devices is disclosed. As can be discerned from FIG. 1 to FIG. 7, the vertical interconnection structure VI may comprise a signal path (i.e., the path provided by at least the signal via structure Vs) disposed in a substrate 10, a first ground plane (e.g., the ground plane $GL_6$) surrounding the signal path, and a first ground pullback region (e.g., the ground pullback region $GP_6$) disposed between the signal path and the first ground plane. The first ground pullback region (e.g., the ground pullback region $GP_6$) electrically isolates the signal path from the first ground plane (e.g., the ground plane $GL_6$). The first ground pullback region (e.g., the ground pullback region $GP_6$) has at least two different widths.

According to some embodiments, the signal path comprises a first via pad (e.g., the via pad $VP_6$). The first ground pullback region (e.g., the ground pullback region $GP_6$) is a gap between the first via pad (e.g., the via pad $VP_6$) and the first ground plane (e.g., the ground plane $GL_6$). According to some embodiments, the signal path further comprises a second via pad (e.g., the via pad $VP_5$), and a signal via (e.g., the signal via $SV_6$) electrically connecting the first via pad (e.g., the via pad $VP_6$) to the second via pad (e.g., the via pad $VP_5$).

According to some embodiments, the vertical interconnection structure further comprises a second ground plane (e.g., ground plane $GL_5$) surrounding the second via pad (e.g., the via pad $VP_5$); and a second ground pullback region (e.g., ground pullback region $GP_5$) disposed between the second via pad (e.g., the via pad $VP_5$) and the second ground plane (e.g., ground plane $GL_5$). The second ground pullback region (e.g., ground pullback region $GP_5$) electrically isolates the second via pad (e.g., the via pad $VP_5$) from the second ground plane (e.g., ground plane $GL_5$). The second ground pullback region (e.g., ground pullback region $GP_5$) has at least two different widths.

According to some embodiments, the vertical interconnection structure further comprises at least one ground via (e.g., ground via $GV_6$) interconnecting the first ground plane (e.g., ground plane $GL_6$) to the second ground plane (e.g., ground plane $GL_5$).

It is advantageous to use the present invention because no extra matching component is needed and 10-30 dB bandwidth improvement for VSWR at 1.2:1 can be achieved within a frequency span of 15-50 GHz. The present invention is suited for radio frequency circuit applications, for example, 5G applications, when propagating high frequency signals from one side of the circuit board to another side.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A vertical interconnection structure of a multi-layer substrate, comprising: a first via pad disposed in a first layer of metal interconnect of the multi-layer substrate; a second via pad disposed in a second layer of metal interconnect of the multi-layer substrate; a signal via electrically connecting the first via pad to the second via pad; a non-circular first ground plane disposed in the first layer of metal interconnect of the multi-layer substrate and surrounding the first via pad; and a non-circular first ground pullback region between the first via pad and the non-circular first ground plane for electrically isolating the first via pad from the non-circular first ground plane, wherein the non-circular first ground pullback region has a shape of partially overlapping rectangles around a perimeter of the first via pad when viewed from above.

2. The vertical interconnection structure of a multi-layer substrate according to claim 1 further comprising:
a non-circular second ground pullback region disposed between the second via pad and the non-circular second ground plane for electrically isolating the second via pad from the non-circular second ground plane.

3. The vertical interconnection structure of a multi-layer substrate according to claim 2, wherein the non-circular second ground pullback region has a rectangular shape, a square shape, a quasi-rectangular shape or a quasi-square shape around a perimeter of the second via pad when viewed from above.

4. The vertical interconnection structure of a multi-layer substrate according to claim 1, wherein the first via pad and the second via pad have a circular shape when viewed from above.

5. The vertical interconnection structure of a multi-layer substrate according to claim 1 further comprising:
a plurality of ground vias interconnecting the non-circular first ground plane to the non-circular second ground plane.

6. The vertical interconnection structure of a multi-layer substrate according to claim 5, wherein the signal via is surrounded by the plurality of ground vias.

7. The vertical interconnection structure of a multi-layer substrate according to claim 5, wherein the plurality of ground vias and the signal via have a strip shape and are in parallel to one another.

8. The vertical interconnection structure of a multi-layer substrate according to claim 7, wherein the plurality of ground vias and the signal via have longitudinal axes that extend along a first direction.

9. The vertical interconnection structure of a multi-layer substrate according to claim 1 further comprising:
a signal trace terminating at the second via pad.

10. The vertical interconnection structure of a multi-layer substrate according to claim 9, wherein the second via pad and the signal trace are backed by a ground plane disposed on a third layer of metal interconnect.

11. The vertical interconnection structure of a multi-layer substrate according to claim 1 further comprising:
a close-loop, ring-type ground via interconnecting the non-circular first ground plane to the non-circular second ground plane.

12. The vertical interconnection structure of a multi-layer substrate according to claim 11, wherein the close-loop, ring-type ground via surrounds the signal via.

13. The vertical interconnection structure of a multi-layer substrate according to claim 1 further comprising:
a dielectric layer between the first layer of metal interconnect and the second layer of metal interconnect.

14. The vertical interconnection structure of a multi-layer substrate according to claim 1, wherein the multi-layer substrate is a packaging substrate or a printed circuit board.

15. A vertical interconnection structure for radio frequency devices, comprising: a signal path disposed in a substrate; a first ground plane surrounding the signal path; and a first ground pullback region disposed between the signal path and the first ground plane, wherein the first ground pullback region electrically isolates the signal path from the first ground plane, and wherein the first ground pullback region has at least two different widths, wherein the non-circular first ground pullback region has a shape of partially overlapping rectangles around a perimeter of the signal path when viewed from above.

16. The vertical interconnection structure for radio frequency device according to claim 15, wherein the signal path comprises a first via pad, and wherein the first ground pullback region is a gap between the first via pad and the first ground plane.

17. The vertical interconnection structure for radio frequency device according to claim 16, wherein the signal path further comprises a second via pad, and a signal via electrically connecting the first via pad to the second via pad.

18. The vertical interconnection structure for radio frequency device according to claim 17 further comprising:
a second ground plane surrounding the second via pad; and a second ground pullback region disposed between the second via pad and the second ground plane, wherein the second ground pullback region electrically isolates the second via pad from the second ground plane, and wherein the second ground pullback region has at least two different widths.

19. The vertical interconnection structure for radio frequency device according to claim 18 further comprising:
at least one ground via interconnecting the first ground plane to the second ground plane.

\* \* \* \* \*